United States Patent
Ang et al.

(10) Patent No.: US 6,376,319 B2
(45) Date of Patent: Apr. 23, 2002

(54) PROCESS TO FABRICATE A SOURCE-DRAIN EXTENSION

(75) Inventors: Ting Cheong Ang; Shyue Fong Quek; Jun Song; Xing Yu, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/972,629

(22) Filed: Oct. 9, 2001

Related U.S. Application Data

(62) Division of application No. 09/443,425, filed on Nov. 19, 1999.

(51) Int. Cl.⁷ ............................................. H01L 21/336
(52) U.S. Cl. ...................... 438/300; 438/301; 438/585; 438/592; 438/299
(58) Field of Search ................................ 438/300, 301, 438/299, 585, 592, 303

(56) References Cited

U.S. PATENT DOCUMENTS

| | | | |
|---|---|---|---|
| 5,750,430 A | 5/1998 | Son | 438/303 |
| 5,874,341 A | 2/1999 | Gardner et al. | 438/301 |
| 5,899,719 A | 5/1999 | Hong | 438/289 |
| 5,918,129 A | 6/1999 | Fulford, Jr. et al. | 438/289 |

*Primary Examiner*—Tuan H. Nguyen
*Assistant Examiner*—Yennhu B. Huynh
(74) *Attorney, Agent, or Firm*—George O. Saile; Rosemary L. S. Pike

(57) ABSTRACT

A process for fabricating a MOSFET device, featuring source/drain extension regions, formed after the utilization of high temperature processes, such as heavily doped source/drain regions, has been developed. Disposable insulator spacers are formed on the sides of doped, SEG silicon regions, followed formation of a gate insulator layer, and an overlying gate structure, on a region of the semiconductor substrate located between the doped SEG silicon regions. The temperature experienced during these process steps result in the formation of the heavily doped source/drain, underlying the SEG silicon regions. Selective removal of the disposable spacers, allows the source/drain extension regions to be placed in the space vacated by the disposable spacers, adjacent to the heavily doped source/drain region. Insulator spacers are then used to fill the spaces vacated by removal of the disposable spacers, directly overlying the source/drain extension regions. Additional iterations include the use of an L shaped spacer, overlying the source/drain extension region, as well as the formation of metal silicide, on the doped SEG silicon regions, and on the gate structures.

9 Claims, 6 Drawing Sheets

PROCESS TO FABRICATE A SOURCE-DRAIN EXTENSION

This is a division of patent application Ser. No. 09/443,425, filing date Nov. 19, 1999, Process To Fabricate A Novel Source-Drain Extension, assigned to the same assignee as the present invention.

BACKGROUND OF THE INVENTION (1) Field of the Invention

The present invention relates to methods used to fabricate semiconductor devices, and more specifically to methods used to fabricate metal oxide semiconductor field effect, (MOSFET), devices, with improved performance, and increased device density, via use of MOSFET process innovations.

(2) Description of Prior Art

Major objectives of the semiconductor industry continues to be increased device performance, and decreased process costs. The trend to micro-miniaturization, or the use of sub-micron features, have allowed these objectives to be successfully addressed. The creation of MOSFET devices, with sub-micron features, results in a reduction in performance degrading parasitic capacitances, while the use of sub-micron features allow the attainment of smaller semiconductor chips, however still accommodating the level of integration supplied by larger counterparts, thus enabling a greater number of smaller semiconductor chips to be obtained from a specific size starting wafer, thus reducing the processing cost for a specific semiconductor chip.

In addition to micro-miniaturization, basically obtained via advances in the photolithographic discipline in terms of more advanced exposure cameras, and more sensitive photoresist materials, specific MOSFET process sequences have also allowed specific MOSFET features to be reduced in size, and by so doing improve device performance. This invention will describe novel MOSFET process sequences used minimize specific MOSFET features, thus enhancing device performance. The formation of a source/drain extension, or a lightly doped source/drain, (LDD), region, accomplished after formation of other features, such as heavily doped source/drain regions, or polycide gate structures, allow this LDD region to maintain the minimum designed dimensions, as a result of avoiding the high temperature processes used for formation of heavily doped source/drain regions, or polycide gate structures. In addition these novel process sequences, used to create the source/drain extension, also allows the attainment of shallower, heavily doped source/drain regions, resulting from the diffusion from an overlying doped epitaxial layer, as well as resulting in a planar top surface topography, both contributing to increased device performance, and increased device density, or process cost reduction. Prior art, such as Hong, in U.S. Pat. No. 5,899,719, describes a sub-Micron MOSFET device, featuring a source/drain extension. However that prior art does not feature the use of selectively grown epitaxial silicon to define a subsequent gate region, and to supply the dopants needed for the heavily doped source/drain region.

SUMMARY OF THE INVENTION

It is an object of this invention to fabricate a MOSFET device, featuring source/drain extension regions, or an LDD regions, formed after formation of heavily doped source/drain regions, and after formation of polycide gate structures.

It is another object of this invention to form shallow, heavily doped source/drain regions, via diffusion from an overlying selective epitaxial grown, (SEG), silicon layer, prior to formation of the source/drain extension regions.

It is still another object of this invention to form a metal silicide layer on the gate structure, as well as on the top surface of the SEG silicon regions, prior to the formation of the source/drain extension regions.

It is still yet another object of this invention to provide a smooth top surface topography for the MOSFET device, by forming the gate structure between SEG silicon regions.

In accordance with the present invention a process for forming a MOSFET device, featuring source/drain extension regions, formed prior to high temperature procedures used to form heavily doped source/drain regions, as well as polycide gate structures, is described. A first iteration of this invention incorporates the formation of doped, SEG silicon regions, on a semiconductor substrate, with a channel region, located in the area of the semiconductor substrate, located between the doped, SEG silicon regions. After formation of first insulator spacers, on the sides of the doped SEG silicon regions, a gate insulator layer, and a polysilicon gate structure, are formed in the space between the first insulator spacers, located on the sides of the doped SEG silicon regions, with the polysilicon gate structure formed to the same height as the doped SEG silicon regions. Selective removal of the first insulator spacers, followed by an ion implantation procedure, create the source/drain extension regions, in an area of the semiconductor substrate located between the overlying, doped SEG silicon regions, and the overlying, polysilicon gate structure. The source/drain extension regions link to the heavily doped source drain regions, located under the doped SEG silicon regions, formed via diffusion from the overlying, doped SEG silicon regions, during previous process steps. Second insulator spacers are then formed, located between the doped SEG silicon regions, and the polysilicon gate structure, with the second insulator spacers overlying the source/drain extension regions, resulting in a MOSFET device with a planar top surface topography.

A second iteration of this invention features the formation of a metal silicide layer, on the top surface of the polysilicon gate structure, and on the top surface of the doped, SEG silicon regions, prior to removal of the first insulator spacers. After removal of the first insulator spacers, the source/drain extension regions are again formed in an area of the semiconductor substrate, located between the overlying doped SEG silicon regions, and the overlying polycide gate structure. Formation of the second spacers is again used, overlying the source/drain extension regions, and to fill the space vacated by the removal of the first insulator spacers.

A third iteration of this invention comprises the formation of L shaped, insulator spacers, located overlying the source/drain extension regions. This is accomplished by forming first insulator spacers on the sides of the doped SEG silicon regions, followed by the formation of an dielectric shape, located between the doped, SEG silicon regions, lined with the first insulator spacers. Selective removal of the first insulator spacers allow the formation of the source/drain extension regions, in an area of the semiconductor substrate, located between the overlying, doped SEG silicon regions, and the overlying dielectric shape. Removal of the first insulator spacers, and of the dielectric shape, is followed by the formation of dual dielectric spacers, on the sides of the doped SEG silicon regions, overlying the source/drain extension regions. Selective removal of the top layer, of the dual dielectric spacers, result in L shaped spacers, on the sides of the doped SEG silicon regions. Gate insulator growth, and polysilicon gate formation, in the region between the doped SEG silicon regions, lined with the L shaped spacers, are then employed.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of fabricating a MOSFET device, featuring a source/drain extension region, or a lightly doped source/drain region, formed prior to the high temperature process procedures used for formation of heavily doped source/drain regions, and for formation of metal silicide layers, will now be described in detail. This invention will be described for a N channel MOSFET device, however this invention can also be applied to P channel, MOSFET devices.

Figure 1:
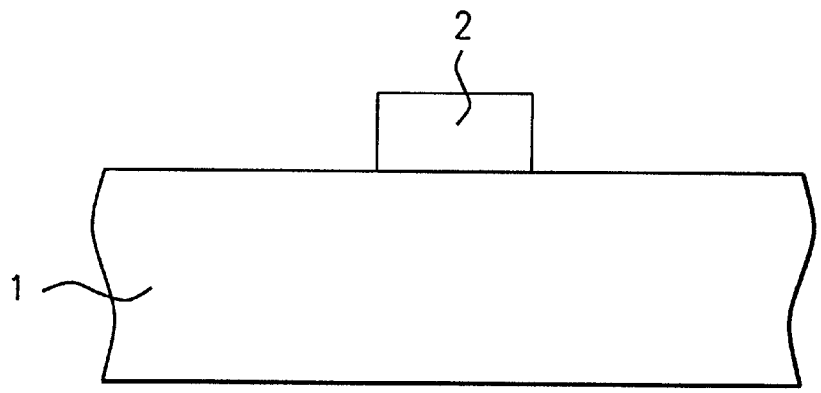
FIGS. 1–7, which schematically, in cross-sectional style, describe key fabrication stages used for a first iteration of this invention, featuring the creation of a source/drain extension region, for a MOSFET device, formed after the high temperature formation of heavily doped source/drain regions.
Figure 2:
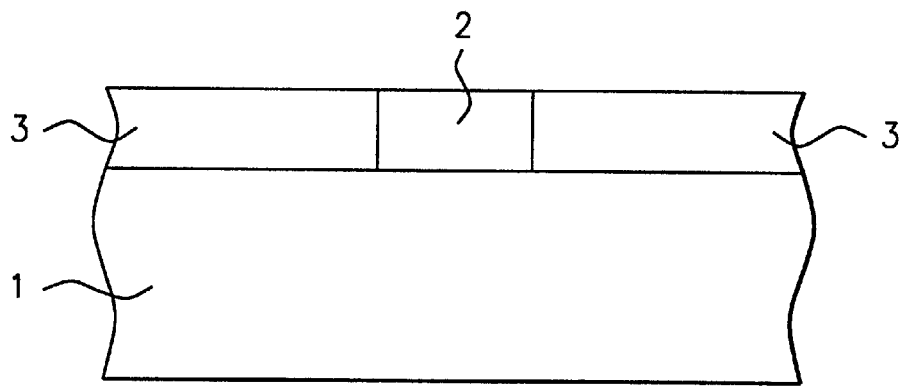

A P type, semiconductor substrate 1, comprised of single crystalline silicon, with a <100>crystallographic orientation, is used and shown schematically in FIG. 1. An insulator layer, such as silicon oxide, is next deposited via low pressure chemical vapor deposition, (LPCVD), or via plasma enhanced chemical vapor deposition, (PECVD), procedures, to a thickness between about 1000 to 3000 Angstroms. Conventional photolithographic and anisotropic, reactive ion etching, (RIE), procedures, using $CBF_3$ as an etchant, are used to create insulator shape 2, also shown schematically in FIG. 1. The photoresist shape used to define insulator shape 2, is removed via plasma oxygen ashing and careful wet cleans. The width of insulator shape 2, will subsequently define the region of semiconductor substrate 1, to be used as the MOSFET channel region, and to accommodate the source/drain extension regions. An undoped, or an in situ doped, epitaxial silicon layer is next selectively grown on exposed regions of semiconductor substrate 1, resulting in selectively grown epitaxial; (SEG), silicon regions 3, shown schematically in FIG. 2. SEG regions 3, are formed via LPCVD procedures, at a temperature between about 600 to 1000° C., to a thickness between about 1000 to 3000 Angstroms, using silane or dichlorosilane as a source, or using disilane and HCl as a source, with hydrogen used as a carrier gas.. The in situ doped SEG regions are formed via the addition of phosphine, for N type SEG regions, or via the addition of diborane, for P type SEG regions, to the source gas, or the SEG regions can be formed from an intrinsic deposition, followed by the ion implantation of phosphorous, or boron ions. The doping level in SEG silicon regions 3, which will be used as a diffusion source to subsequently create underlying heavily doped source/drain regions, is between about 1E22 to 1E23 atoms/$cm^3$.

Figure 3:
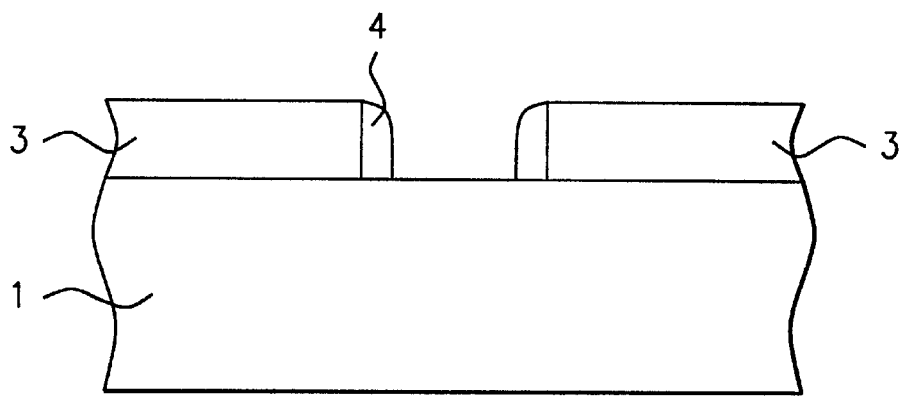

Insulator shape 2, is next selectively removed via use of a buffered hydrofluoric acid solution. This can be seen in FIG. 3. Ion implantation procedures are next employed to place a threshold adjust region, and a anti-punch through region, (not shown in the drawings), in the channel region, or the region of semiconductor substrate 1, not covered by SEG silicon regions 3. An insulator layer, such as silicon oxide, or silicon nitride, is next deposited using either LPCVD or PECVD procedures, to a thickness between about 300 to 800 Angstroms. A selective, anisotropic RIE procedure, using $CHF_3$ as an etchant, is then employed to create insulator spacers 4, on the sides of SEG silicon regions 3. This is schematically shown in FIG. 3. The thickness of the insulator layer, or the width of insulator spacers 4, will subsequently determine the dimension of the source/drain extension regions.

Figure 4:
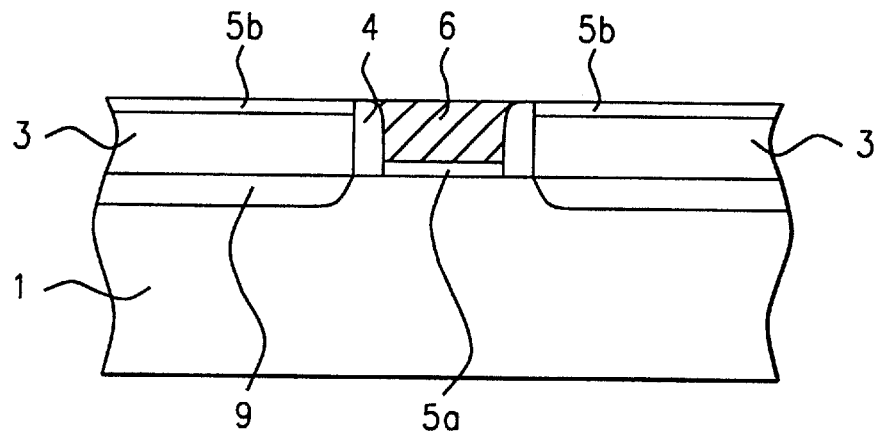

A gate insulator layer 5a, comprised of silicon dioxide, is next thermally grown on the exposed surface of semiconductor substrate 1, to a thickness between about 10 to 200 Angstroms, using an oxygen-steam ambient, at a temperature between about 600 to 1100° C. During the oxidation procedure, silicon dioxide layer 5b, is also formed on the top surface SEG silicon regions 3. This is schematically shown in FIG. 4. If desired gate insulator layer 5a, can be comprised of nitrided oxide, silicon nitride, tantalum oxide, or titanium oxide. Also shown in FIG. 4, as the result of out diffusion from SEG silicon regions 3, during the gate insulator oxidation procedure, is the creation of heavily doped source/drain regions 9, directly underlying SEG silicon regions 3. A polysilicon layer is next deposited using LPCVD procedures, to a thickness between about 1000 to 3000 Angstroms. The polysilicon layer can be doped in situ, during deposition, via the addition of arsine, or phosphine, to a silane ambient, or the polysilicon layer can be deposited intrinsically, then doped via ion implantation of arsenic or phosphorous ions. A chemical mechanical polishing, (CMP), procedure is next used to remove regions of the polysilicon layer from silicon dioxide layer 5b, resulting in the formation of polysilicon gate structure 6, shown schematically in FIG. 4. If desired polysilicon gate structure 6, can be defined via a selective RIE procedure, using $Cl_2$ or $SF_6$ as an etchant, selectively stopping on silicon dioxide layer 5b.

Figure 5:
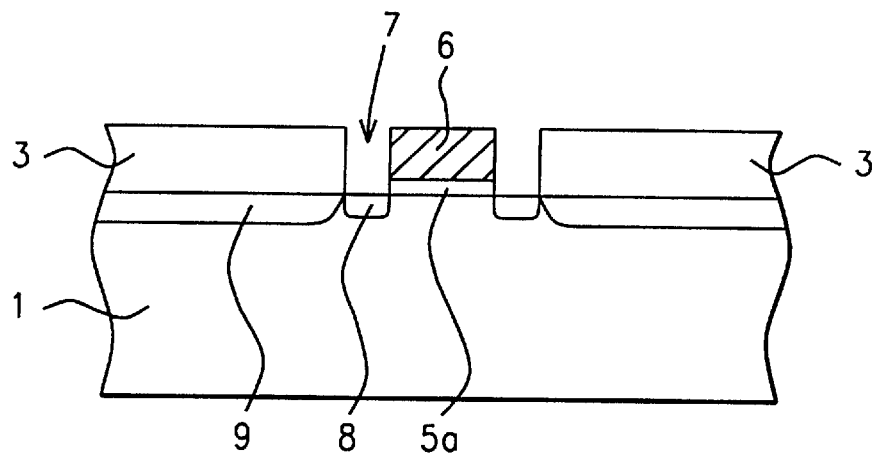

Insulator spacers 4, are next selectively removed, via use of a buffered hydrofluoric acid solution, creating space 7, located between SEG silicon regions 3, and polysilicon gate structure 6. This is schematically shown in FIG. 5. The buffered hydrofluoric acid procedure, used to remove insulator spacers 4, also results in the removal of silicon dioxide layer 5b, from the top surface of SEG silicon regions 3. Critical source/drain extension regions 8, are now formed in the region of semiconductor substrate 1, exposed in space 7. Source/drain extension regions 8, shown schematically in FIG. 5, are formed via implantation of arsenic, or phosphorous ions, at an energy between about 3 to 100 KeV, and at a dose between about 5E13 to 1E15 atoms/$cm^2$. Source/drain extension regions 8, have now been formed at a stage of the MOSFET device fabrication sequence, after the high temperature processing steps have already been performed, thus avoiding out diffusion and movement of this region during the concluding MOSFET processing sequences.

Spaces 7, used to allow formation of source/drain extension regions 8, are next refilled with insulator spacers 10, schematically shown in FIG., 6. This is accomplished via deposition of an insulator layer, such as silicon oxide, via LPCVD or PECVD procedures, to a thickness between about 1000 to 3000 Angstroms, completely filling spaces 7. A CMP procedure is then employed to selectively remove the insulator layer from the top surfaces of SEG silicon regions 3, and from polysilicon gate structure 6, resulting in the formation of insulator spacers 10, directly overlying source/drain extension region 8, and located between SEG silicon regions 3, and polysilicon gate structure 6. A selective RIE procedure, using $CHF_3$ as an etchant can be used, if desired, to form insulator spacers 10, via removal of unwanted regions of the insulator layer.

Figure 7:
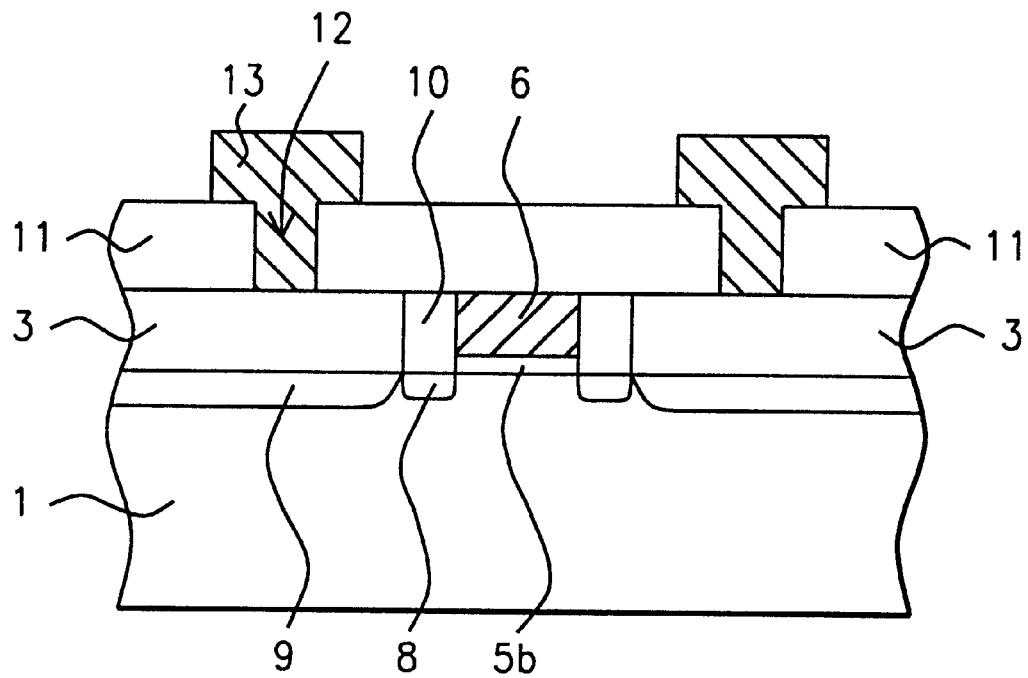

The use of SEG silicon regions 3, overlying heavily doped source/drain regions 9, existing at the same height, or level, as polysilicon gate structure 6, enables a planar top surface topography, for the MOSFET device, to be achieved at this processing stage, reducing the complexity for subsequent processing. An interlevel dielectric, (ILD), layer 11, comprised of silicon oxide, or comprised of a borophosphosilicate glass, is next deposited via LPCVD or PECVD procedures, to a thickness between about 6000 to 20000 Angstroms. Conventional photolithographic and RIE procedures, using $CHF_3$ as an etchant, are used to open contact holes 12, in ILD layer 11, shown schematically in FIG. 7, exposing a portion of the top surface of SEG silicon regions 3. Another contact hole, not shown in the drawings, is formed in insulator layer 11, exposing a portion of the top surface of polysilicon gate structure 6. After removal of the photoresist shape, used for definition of contact holes 12, metal structures 13, are formed in contact holes 12, overlying, and contacting, SEG silicon regions 3, which in turn overlay and contact, heavily doped source/drain regions 9. Metal structures 13, are formed via deposition of a metal, chosen from a group containing; aluminum, aluminum-copper, copper, or tungsten, via plasma vapor deposition, or via R.F. sputtering procedures, to a thickness between about 8000 to 25000 Angstroms. Conventional photolithographic and RIE procedures, using $Cl_2$ or $SF_6$ as an etchant, are used to define metal structures 13, schematically shown in FIG. 7. Removal of the photoresist shape, used for definition of metal structures 13, is then performed via plasma oxygen ashing and careful wet cleans.

Figure 8:
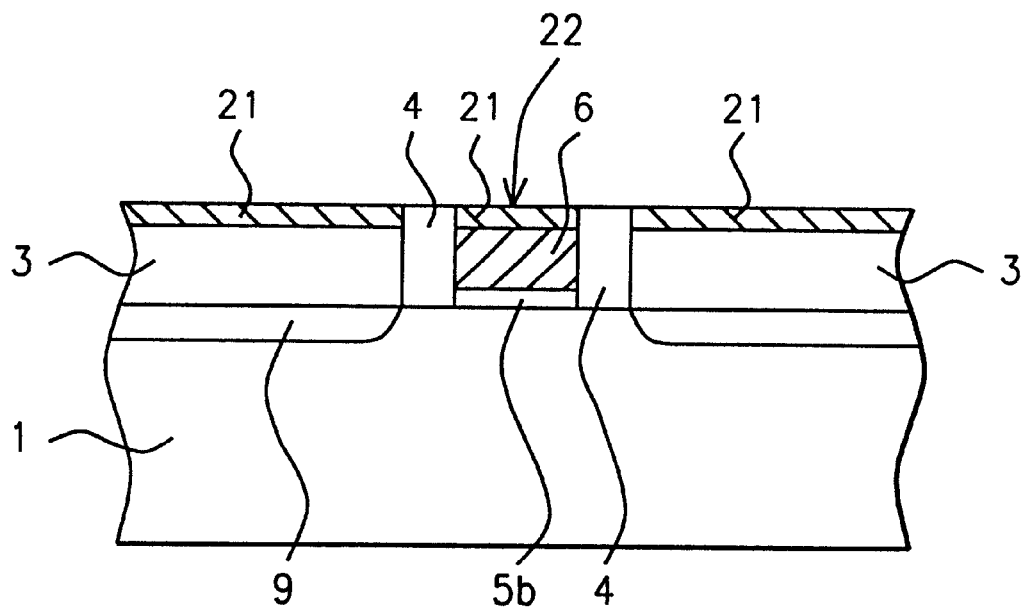
FIGS. 8–10, which schematically, in cross-sectional style, describe key fabrication stages used for a second iteration of this invention, featuring the creation of a source/drain extension region, for a MOSFET device, formed after the high temperature formation of heavily doped source/drain regions, and after the high temperature formation of a metal silicide layer.

A second iteration of this invention is the use of a metal silicide layer, on the top surface of SEG silicon regions 3, and the use of a polycide, (metal silicide- polysilicon), gate structure. Referring to FIG. 8, at the stage of processing in which polysilicon gate structure 6, has been formed, located between insulator spacers, a metal layer, such as titanium, or cobalt, is deposited, via plasma vapor deposition, or via R.F. sputtering procedures, at a thickness between about 200 to 600 Angstroms. An anneal procedure, performed using either conventional furnace procedures, or using rapid thermal anneal, (RTA), procedures, is used at a temperature between about 700 to 900° C., to form metal silicide layer 21, (titanium disilicide or cobalt silicide), on the top surface of SEG silicon regions 3, and on the top surface of polysilicon gate structure 6. Removal of unreacted metal, from the top surface of insulator spacers 4, is next accomplished using a solution comprised of $H_2SO_4$, $H_2O_2$, HCl, and $NH_4OH$. A second anneal cycle can be employed if desired to reduce the resistance of polycide gate structure 22, comprised of metal silicide layer 21, on polysilicon gate structure 6. This is schematically shown in FIG. 8.

Figure 6:
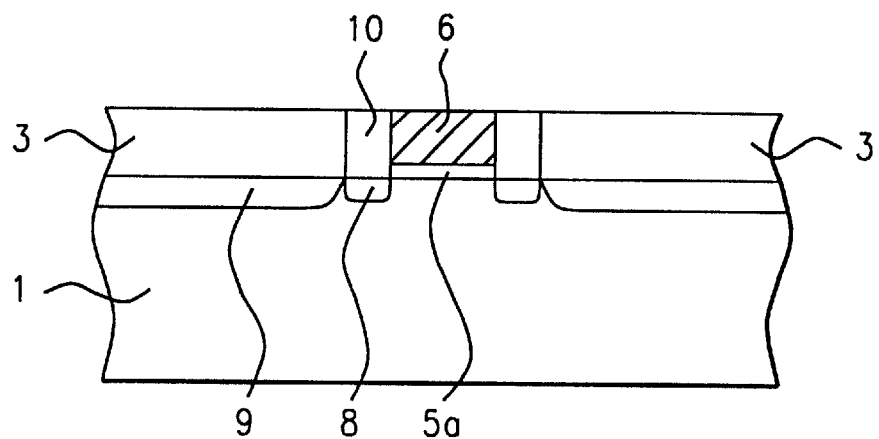
Figure 9:
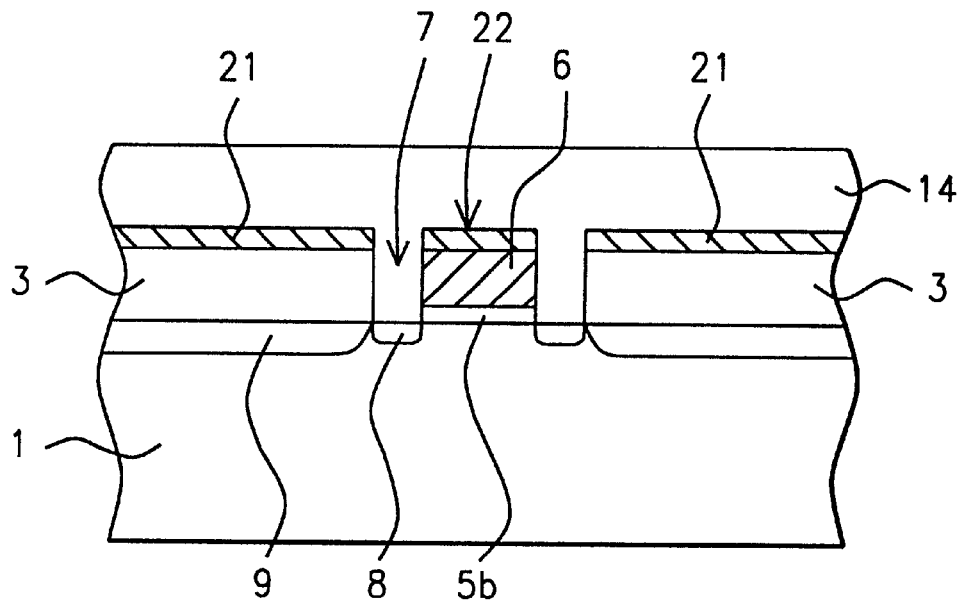
Figure 10:
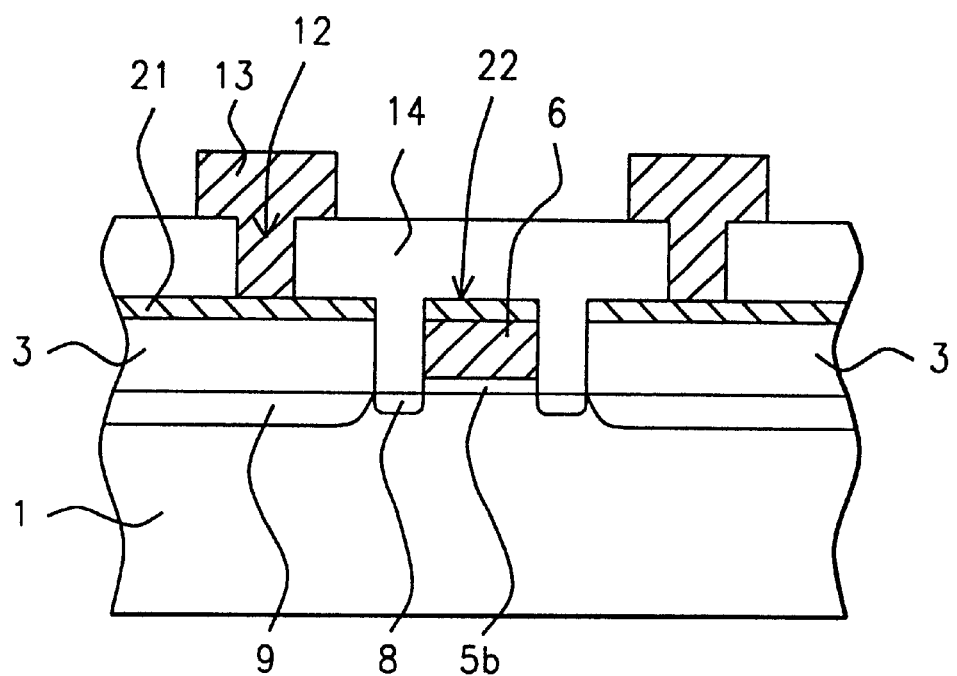

Selective removal of insulator spacers 4, and the formation of source/drain extension regions 8, are accomplished using identical procedures as previously described for the first iteration of this invention, and shown in FIG. 5. At this stage of MOSFET fabrication, either second spacers can be formed between SEG silicon regions 3, and polycide gate structure 22, followed by the formation of metal structures, contacting underlying conductive regions, again using the identical procedures described in the first iteration of this invention, schematically described in FIGS. 6–7. However if desired, after formation of source/drain extensions 8, in space 7, an ILD layer 14, comprised of silicon oxide, can be deposited via LPCVD or PECVD procedures, to a thickness between about 6000 to 20000 Angstroms, completely filling spaces 7, as well as overlying the top surfaces of polycide gate structure 22, and SEG silicon regions 3. This is schematically shown in FIG. 9. Contact holes 12, can again be formed, in ILD layer 14, followed by the formation of metal structures 13, overlying and contacting, the top surface of SEG silicon regions 3. This is schematically shown in FIG. 10. Although not shown in the drawings, a metal contact structure is also formed on a portion of the top surface of polycide gate structure 22. In this iteration ILD layer 14, also serves as the insulator spacer, located between SEG silicon regions 3, and polycide gate structure 22.

Figure 11:
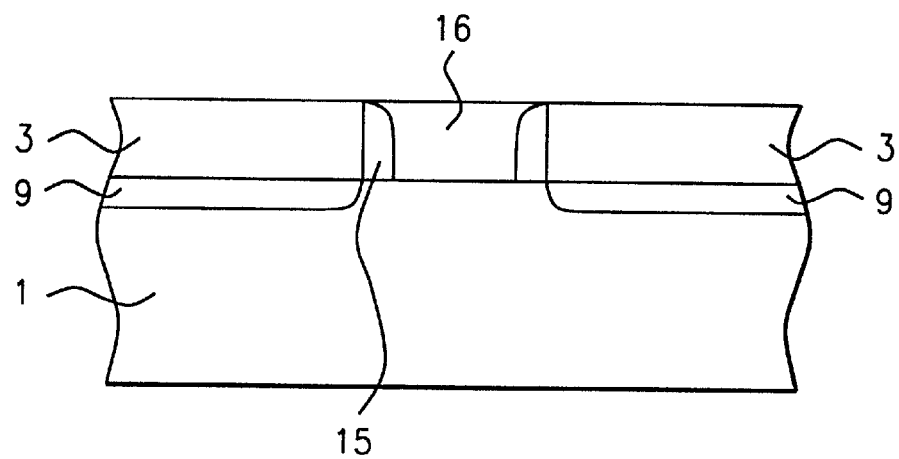
FIGS. 11–15, which schematically, in cross-sectional style, describe key fabrication stages used with a third iteration of this invention, featuring the formation of an L shaped spacer, overlying a source/drain extension region, which in turn is formed prior to the formation of heavily doped source/drain regions.
Figure 12:
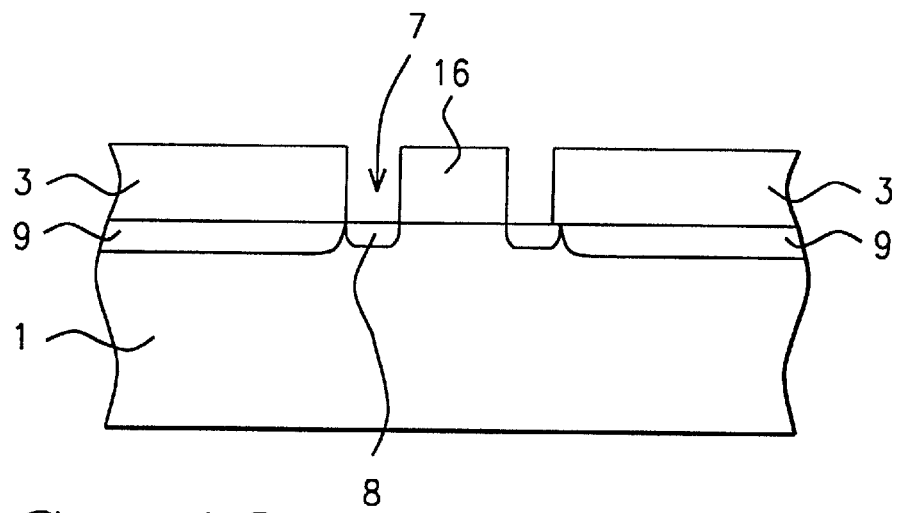

A third iteration of this invention, schematically shown in FIGS. 11–15, featuring an L shaped, insulator spacer, is next described. In this iteration first insulator spacers 15, are formed on the sides of SEG silicon shapes 3, with first insulator spacers comprised of an insulator layer such as silicon nitride, or silicon oxide, at a thickness between about 300 to 800 Angstroms. Another insulator layer, such as silicon oxide, or silicon nitride, is next deposited, and subjected to a CMP procedure, resulting in insulator shape 16, located between first insulator spacers 15, which in turn are located on the sides of SEG silicon regions 3. An anneal cycle is used to form heavily doped source/drain regions 9, via out diffusion from overlying SEG silicon regions 3. This is accomplished prior to the subsequent formation of source/drain extension regions 8. The results of these processes is schematically shown in FIG. 11.

Figure 13:
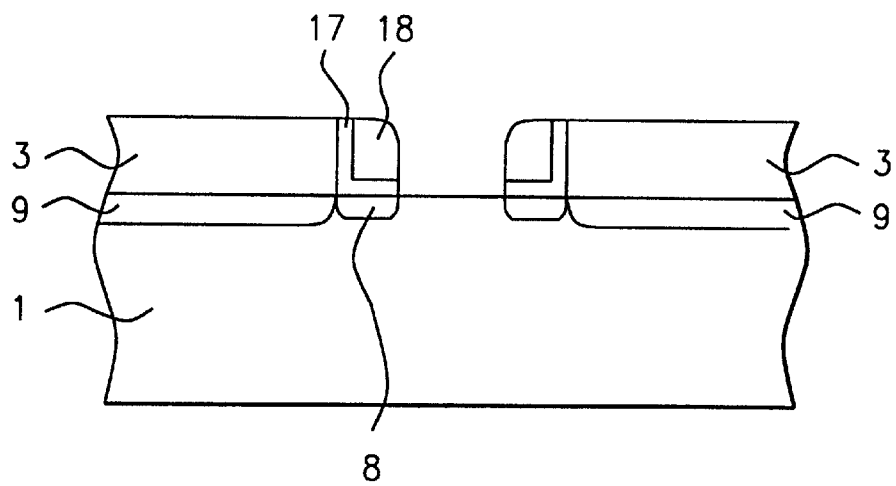

Selective removal of first insulator spacers 15, is next accomplished using a hot phosphoric acid solution, if first insulator shapes are comprised of silicon nitride, or via a buffered hydrofluoric acid solution, if first insulator shapes are comprised of silicon oxide, resulting in spaces 7, located between SEG silicon regions 3, and insulator shape 16. This is followed by the formation of source/drain extension regions 8, using procedures identical to the procedures previously described for formation of source/drain extension regions 8. This is shown schematically in FIG. 12. After removal of insulator shape 16, via use of a buffered hydrofluoric acid solution, or a hot phosphoric acid solution, a composite insulator layer, comprised of an underlying silicon oxide layer, and an overlying silicon nitride layer, is deposited. The silicon oxide layer is obtained via LPCVD or PECVD procedures, using TEOS as a source, at a thickness between about 100 to 200 Angstroms, while the silicon nitride layer is also obtained using LPCVD or PECVD procedures, at a thickness between about 200 to 600 Angstroms. The thickness of the composite insulator layer is equal to the thickness of previously removed, first insulator spacers 15, allowing a subsequent composite spacer to completely overlay source/drain extension regions 8. Anisotropic RIE procedures, using $Cl_2$ as an etchant for silicon nitride, and using $CHF_3$ as an etchant for silicon oxide, are used to form the composite insulator spacers, comprised of silicon nitride spacers 18, on underlying silicon oxide spacers 17. This is schematically shown in FIG. 13. If desired silicon oxide can be used for overlying spacer 18, while silicon nitride is used for underlying spacer 17.

Figure 14:
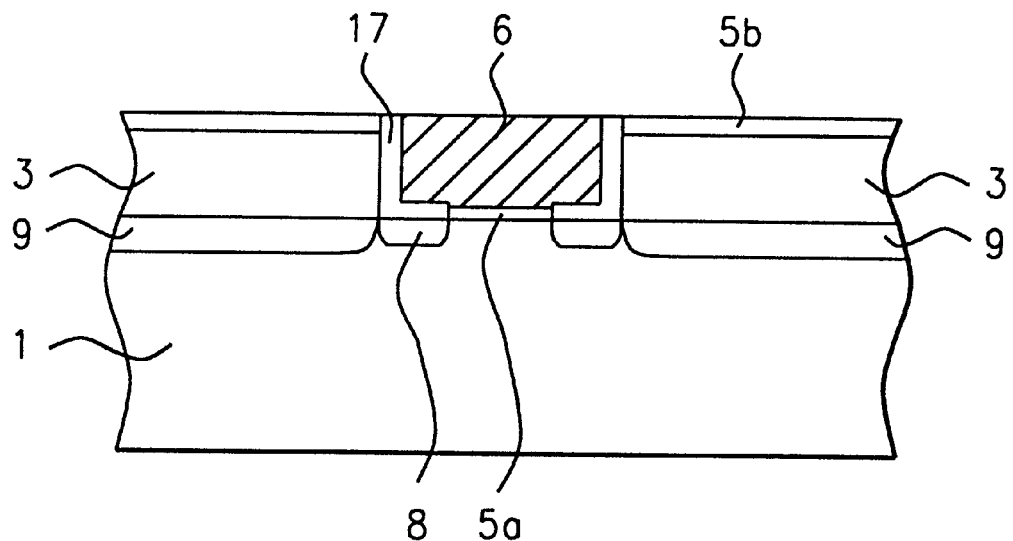
Figure 15:
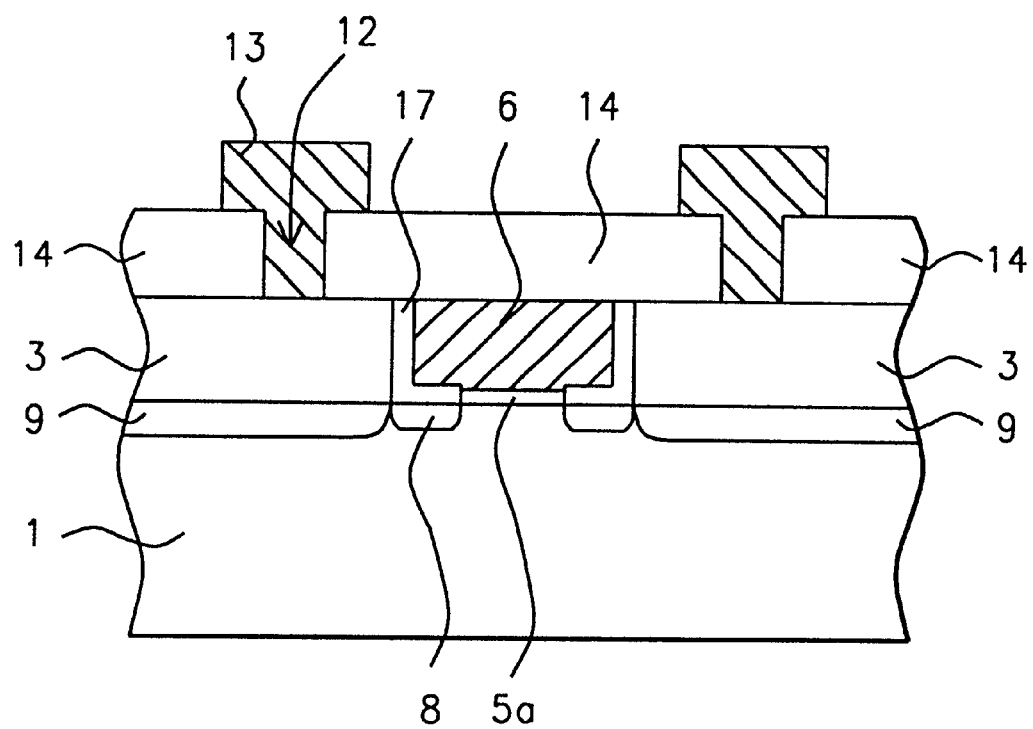

Selective removal of spacer 18, via hot phosphoric acid if spacer 18, is comprised of silicon nitride, or via a buffered hydrofluoric acid solution, if spacer 18, is comprised of silicon oxide, resulting in L shape spacer 17, shown schematically in FIG. 14, completely covering source/drain extension region 8. Gate insulator layer 5a, and polysilicon gate structure 6, are next formed using procedures identical to procedures previously described in the first iteration of this invention, and previously shown in FIG. 4. ILD layer 14, contact holes 12, and metal structures 13, are again formed using identical procedures used to form these same features and structures, previously described in the first iteration of this invention. The MOSFET device, featuring, source/drain extensions 8, underlying L shaped spacer 17, is schematically shown in FIG. 15.

While this invention has been particularly shown and described with reference to the preferred embodiments thereof, it will be understood by those skilled in the art that various changes in form and details may be made without departing from the spirit or scope of the invention.

What is claimed is:

1. A method of forming a MOSFET device, on a semiconductor substrate, featuring source/drain extension regions, formed after formation of heavily doped source/drain regions, and after formation of a polycide gate structure, comprising the steps of:

forming SEG silicon regions on second portions of said semiconductor substrate, with said SEG regions comprised with dopants, and with a first portion of said semiconductor substrate, exposed between the doped, SEG silicon regions;

forming first insulator spacers on the sides of said doped, SEG silicon regions;

growing a silicon dioxide gate insulator layer on the surface of said first portion of said semiconductor substrate, resulting in out diffusion of a portion of said dopants, from said doped, SEG silicon regions, forming said heavily doped source/drain regions directly underlying said doped, SEG silicon regions;

forming a polysilicon gate structure on said silicon dioxide gate insulator layer;

forming a metal silicide layer on the top surface of said doped, SEG silicon regions, and on the top surface of said polysilicon gate structure, creating said polycide gate structure;

selectively removing said first insulator spacers, resulting in exposure of third portions of said semiconductor substrate, located between said doped, SEG silicon regions, and said polycide gate structure;

forming said source/drain extension regions in said third portions of said semiconductor substrate;

depositing an ILD layer, with a first portion of said ILD layer completely filling spaces between said doped, SEG silicon regions, and said polycide gate structure, and with a second portion of said ILD layer overlying said doped, SEG silicon regions, and overlying said polycide gate structure;

forming contact holes in said second portion of said ILD layer, exposing a portion of the top surface of said doped, SEG silicon regions, and a portion of the top surface of said polycide gate structure; and forming metal structures in said contact holes.

2. The method of claim 1, wherein said SEG silicon regions are formed via selective epitaxial growth of a silicon layer, at a temperature between about 600 to 1000° C., to a thickness between about 1000 to 3000 Angstroms, using silane, or dichlorosilane, as a source, or using disilane and HCl, as a source, with hydrogen used as a carrier gas.

3. The method of claim 1, wherein said SEG silicon regions are either doped in situ, during deposition, via the addition of phosphine, or diborane, to a silane, dichlorosilane, or disilane ambient, or SEG silicon regions are grown intrinsically, then doped via implantation of phosphorous, or boron ions, resulting in a dopant concentration, for said SEG regions, between about 1E22 to 1E23 atoms/cm$^3$.

4. The method of claim 1, wherein said first insulator spacers are comprised of silicon oxide, obtained via LPCVD or PECVD procedures, at a thickness between about 300 to 800 Angstroms, and defined via an anisotropic RIE procedure, using $CHF_3$ as an etchant.

5. The method of claim 1, wherein said silicon dioxide gate insulator layer is obtained via thermal oxidation procedures, to a thickness between about 10 to 200 Angstroms, at a temperature between about 600 to 1100° C., in an oxygen-steam ambient.

6. The method of claim 1, wherein said polysilicon gate structure is formed from a polysilicon layer, obtained via LPCVD procedures, to a thickness between about 1000 to 3000 Angstroms, with the polysilicon layer either doped in situ, during deposition, via the addition of arsine, or phosphine, to a silane ambient, or via implantation of arsenic or phosphorous ions, into an intrinsically grown polysilicon layer.

7. The method of claim 1, wherein said metal silicide layer is either a titanium silicide layer, or a cobalt silicide layer, obtained via deposition of a titanium, or a cobalt layer, via plasma vapor deposition procedures, at a thickness between about 200 to 600 Angstroms, followed by anneal cycle, performed at a temperature between about 700 to 900° C., and removal of unreacted titanium, or cobalt.

8. The method of claim 1, wherein said first insulator spacers are removed using a buffered hydrofluoric acid solution.

9. The method of claim 1, wherein said source/drain extension regions are formed via an ion implantation procedure, using arsenic, or phosphorous ions, at an energy between about 3 to 100 KeV, and at a dose between about 5E13 to 1E15 atoms/cm$^2$.

* * * * *